United States Patent
Choi et al.

(10) Patent No.: US 12,405,685 B2
(45) Date of Patent: Sep. 2, 2025

(54) FLEXIBLE DISPLAY DEVICE WITH AUXILIARY SPACER

(71) Applicant: LG Display Co., Ltd., Seoul (KR)

(72) Inventors: Suk Choi, Hwaseong-si (KR); Gyuho Lee, Seoul (KR); Sangwook Woo, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/384,114

(22) Filed: Oct. 26, 2023

(65) Prior Publication Data

US 2024/0057373 A1 Feb. 15, 2024

Related U.S. Application Data

(63) Continuation of application No. 17/520,080, filed on Nov. 5, 2021, now Pat. No. 11,839,102.

(30) Foreign Application Priority Data

Dec. 30, 2020 (KR) ........................ 10-2020-0188301

(51) Int. Cl.
*H10K 50/844* (2023.01)
*G06F 3/041* (2006.01)
(Continued)

(52) U.S. Cl.
CPC ............ *G06F 3/0412* (2013.01); *G09F 9/301* (2013.01); *H10K 59/12* (2023.02); *H10K 59/40* (2023.02);
(Continued)

(58) Field of Classification Search
CPC ........ G06F 3/041; G06F 3/0412; G06F 3/044; G06F 3/0443; G06F 3/0446;
(Continued)

(56) References Cited

U.S. PATENT DOCUMENTS 9,030,289 B2 5/2015 Lai
10,114,491 B1 10/2018 Han
(Continued)

FOREIGN PATENT DOCUMENTS

CN 106611774 A 5/2017
CN 108022958 A 5/2018
(Continued)

OTHER PUBLICATIONS

German Office Action for German Application No. 10 2021 006 462.3, dated Apr. 30, 2024, with English translation.
(Continued)

*Primary Examiner* — Julie Anne Watko
(74) *Attorney, Agent, or Firm* — Birch, Stewart, Kolasch & Birch, LLP

(57) ABSTRACT

A flexible display device can include a display area in which a plurality of sub pixels is disposed and a non-display area which encloses the display area, a flexible substrate including a folding area and a non-folding area with a folding axis, a thin film transistor disposed on the flexible substrate, an organic light emitting diode disposed on the thin film transistor, and an encapsulation layer disposed on the organic light emitting diode. Also, a touch buffer layer is disposed on the encapsulation layer, a touch sensor layer which is disposed on the encapsulation layer and includes a plurality of touch electrodes, and a dam is disposed on the flexible substrate corresponding to the non-display area. Further, an auxiliary spacer is disposed on the flexible substrate so as to overlap at least a part of an outer circumference of the dam.

17 Claims, 11 Drawing Sheets

(51) Int. Cl.
  *G06F 3/044* (2006.01)
  *G09F 9/30* (2006.01)
  *H10K 59/12* (2023.01)
  *H10K 59/40* (2023.01)
  *H10K 59/80* (2023.01)
  *H10K 77/10* (2023.01)
  *H10K 59/122* (2023.01)
  *H10K 102/00* (2023.01)

(52) U.S. Cl.
  CPC ......... *H10K 59/873* (2023.02); *H10K 77/111* (2023.02); *G06F 3/041* (2013.01); *G06F 3/044* (2013.01); *G06F 3/0443* (2019.05); *G06F 3/0446* (2019.05); *G06F 2203/04102* (2013.01); *G06F 2203/04112* (2013.01); *H10K 59/122* (2023.02); *H10K 2102/311* (2023.02)

(58) Field of Classification Search
  CPC . G06F 2203/04102; G06F 2203/04103; G06F 2203/04112; G09F 9/301; H10K 50/844; H10K 59/12; H10K 59/122; H10K 59/131; H10K 59/40; H10K 59/973; H10K 77/111; H10K 2102/311; H10K 59/873; Y02E 10/549
  See application file for complete search history.

(56) References Cited

U.S. PATENT DOCUMENTS

| | | |
|---|---|---|
| 2011/0193794 A1 | 8/2011 | Hu et al. |
| 2014/0292714 A1 | 10/2014 | Lee et al. |
| 2018/0033831 A1 | 2/2018 | An et al. |
| 2018/0069196 A1 | 3/2018 | Lee et al. |
| 2019/0129551 A1 | 5/2019 | Lee et al. |
| 2019/0131364 A1 | 5/2019 | Hayk et al. |
| 2019/0165312 A1* | 5/2019 | Bae .......... G09G 3/20 |
| 2019/0178466 A1 | 6/2019 | Kim et al. |
| 2020/0027416 A1* | 1/2020 | Kim .......... G06F 3/04166 |
| 2020/0089369 A1* | 3/2020 | Bang .......... G06F 3/0416 |
| 2020/0192513 A1 | 6/2020 | Zhou |
| 2020/0212364 A1 | 7/2020 | Kim et al. |
| 2020/0379595 A1 | 12/2020 | Kim |
| 2022/0223664 A1* | 7/2022 | Kim .......... H10K 59/131 |

FOREIGN PATENT DOCUMENTS

| | | | |
|---|---|---|---|
| CN | 109148517 A | 1/2019 | |
| CN | 110896094 A | 3/2020 | |
| CN | 111048681 A | 4/2020 | |
| CN | 111542941 A | 8/2020 | |
| KR | 10-2017-0075909 A | 7/2017 | |
| KR | 10-2019-0061699 A | 6/2019 | |
| KR | 20190075503 A * | 7/2019 | |
| WO | WO 2015/007054 A1 | 1/2015 | |
| WO | WO-2021149108 A1 * | 7/2021 | .......... H01L 27/3276 |

OTHER PUBLICATIONS

Taiwanese Office Action and Search Report for Taiwanese Application No. 110145248, dated Jan. 7, 2023, with an English translation of the Office Action.

United Kingdom Office Action and Search Report for United Kingdom Application No. GB2117809.9, dated Jul. 19, 2022.

* cited by examiner

FLEXIBLE DISPLAY DEVICE WITH AUXILIARY SPACER

CROSS-REFERENCE TO RELATED APPLICATIONS

This application is a continuation Application of U.S. application Ser. No. 17/520,080, filed on Nov. 5, 2021, which claims priority to Korean Patent Application No. 10-2020-0188301 filed on Dec. 30, 2020 in the Korean Intellectual Property Office, where the entire contents of all these applications are expressly incorporated by reference into the present application.

BACKGROUND

Field

The present disclosure relates to a flexible display device, and more particularly, to a manufacturing method of a flexible display device which improves impact resistance to minimize a dent which may be caused during the folding and to suppress a crack of a touch sensor layer due to the external impact by relieving the stress.

Description of the Related Art

Unlike a liquid crystal display (LCD) device which includes a backlight, an organic light emitting display (OLED) device does not require a separate light source. Therefore, the organic light emitting display device can be manufactured to be light and thin and has process advantages as well as having a low power consumption due to the low voltage driving.

First of all, the organic light emitting display device includes a self-emitting element and layers formed of thin organic films. Due to this configuration, the flexibility and elasticity can be superior to other display devices and thus it is advantageous to be implemented as a flexible display device.

The flexible display device can be formed of a flexible material to be bendable or foldable and has an excellent flexibility to be easily implemented to have various shapes. However, during the impact test, problems such as dark spots of the touch line and the pixel can be produced so that the reliability of the impact resistance can deteriorate. Further, a dent can occur during the impact resistance test or the folding.

Furthermore, a touch device is provided on a front surface of the display panel to allow a user to easily and conveniently input information or commands. However, there is a limitation in that during the folding, the touch electrode, the wiring line, and the like can be cracked due to the external impact.

SUMMARY OF THE DISCLOSURE

An object to be achieved by the present disclosure is to provide a flexible display device with an improved impact resistance and an improved folding reliability.

Specifically, an object of the present disclosure is to provide a flexible display device which has improved impact resistance and foldability to suppress a crack of the touch electrode due to the external impact and minimize the dent.

Further, another object to be achieved by the present disclosure is to dispose an auxiliary spacer to control a flowability of an adhesive when a cover member is bonded to facilitate a bonding process and remove an adhesiveness defect and an appearance defect due to residuals.

Objects of the present disclosure are not limited to the above-mentioned objects, and other objects, which are not mentioned above, can be clearly understood by those skilled in the art from the following descriptions.

According to an aspect of the present disclosure, a flexible display device includes a flexible substrate including a folding area and a non-folding area with a folding axis; a thin film transistor disposed on the flexible substrate; an organic light emitting diode disposed on the thin film transistor; an encapsulation layer disposed on the organic light emitting diode; and a touch sensor layer which is disposed on the encapsulation layer and includes a plurality of touch electrodes; a protective layer disposed on the touch sensor layer; and a plurality of shock-proof pattern units disposed on the protective layer, wherein each of the plurality of touch electrodes includes a plurality of metal lines and each of the plurality of shock-proof pattern units is disposed on the protective layer so as to overlap at least a part of the plurality of metal lines.

Other detailed matters of the exemplary embodiments are included in the detailed description and the drawings.

According to the present disclosure, in the flexible display device, a shock-proof pattern unit is disposed to overlap a metal line of a touch sensor layer to improve an impact resistance and a foldability. By doing this, a dent which may be caused due to the external impact or the folding can be minimized, and a crack of the touch sensor layer, the separation of the organic layer, and the like can be suppressed.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
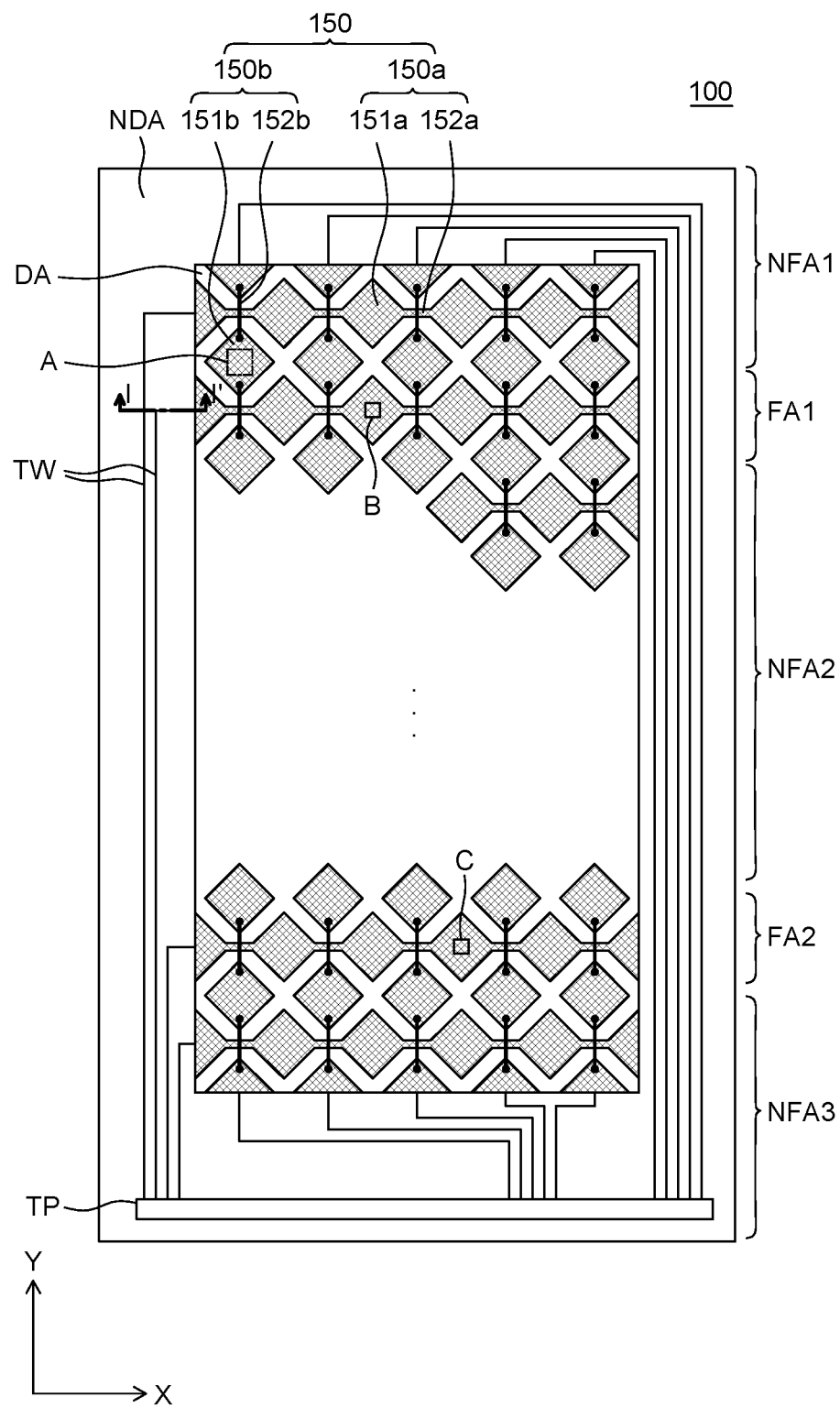
FIG. 1 is a schematic plan view of a flexible display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification.

Further, in the following description of the present disclosure, a detailed explanation of known related technologies can be omitted to avoid unnecessarily obscuring the subject matter of the present disclosure. The terms such as "including," "having," and "consist of" used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components and may not define order. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a flexible display device according to exemplary embodiments of the present disclosure will be described in detail with reference to accompanying drawings. All the components of each flexible display device according to all embodiments of the present disclosure are operatively coupled and configured.

FIGS. 1 to 4 are views for explaining a flexible display device according to an exemplary embodiment of the present disclosure.

Figure 2A:
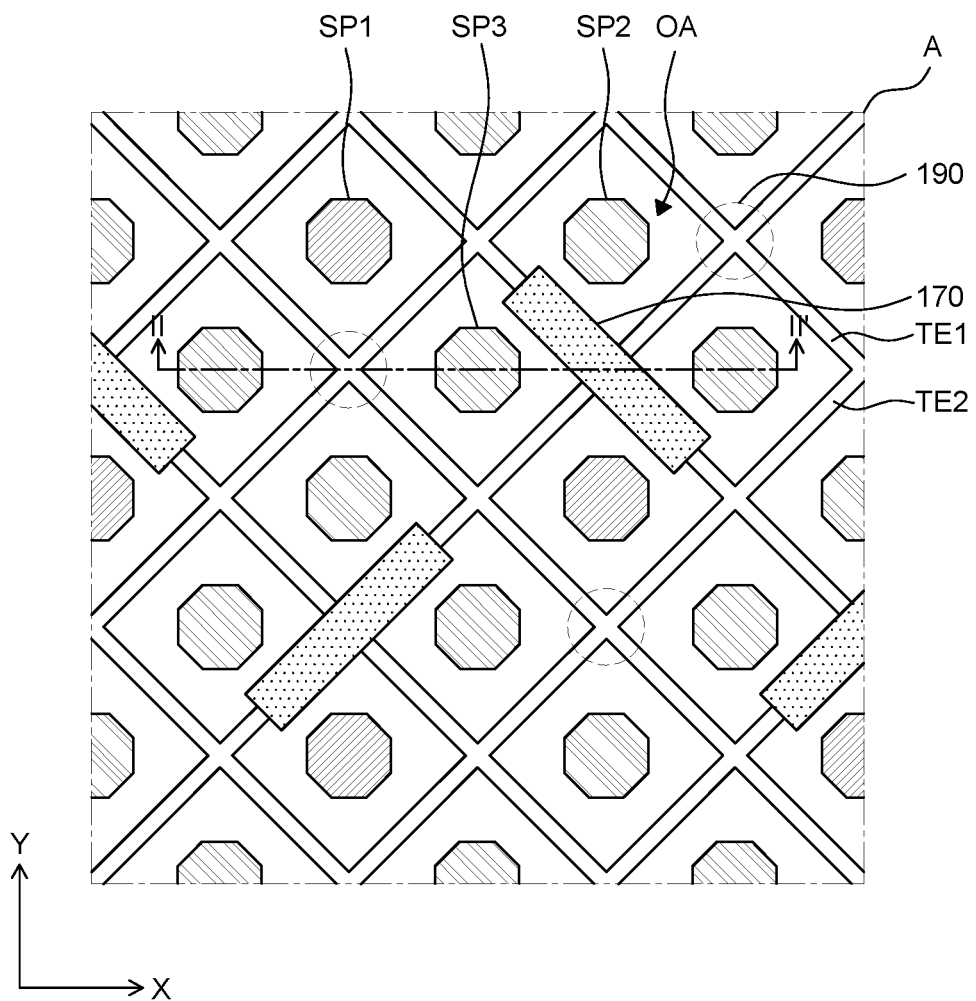
FIG. 2A and FIG. 2B show a schematic enlarged plan view of an area A of FIG. 1.
Figure 2B:
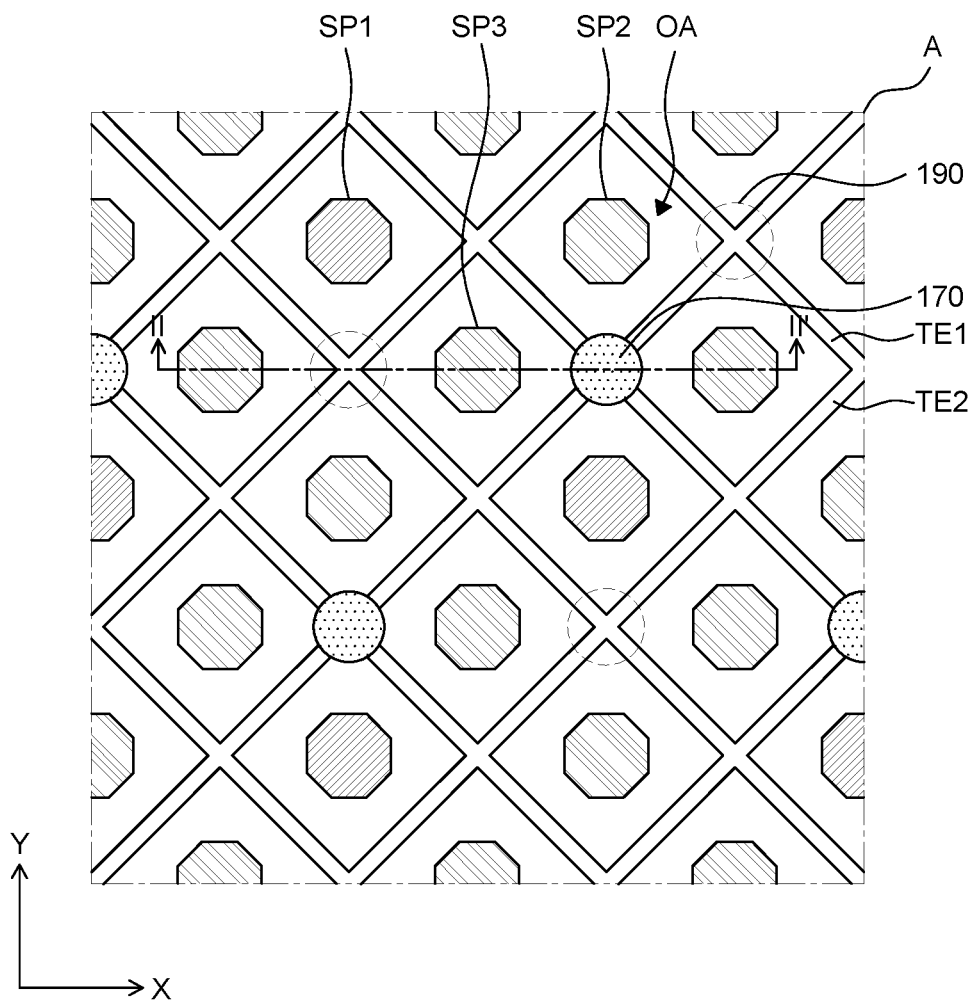
Figure 3:
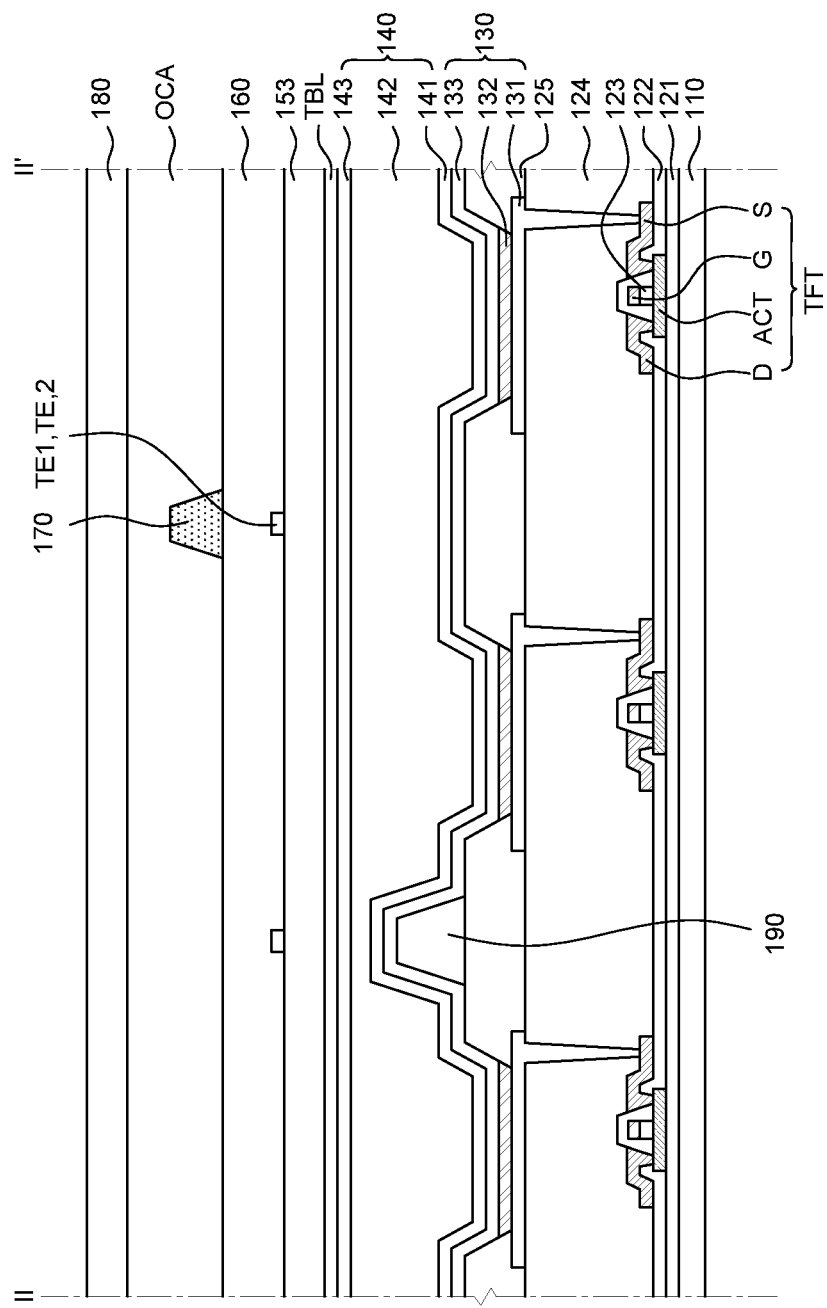
FIG. 3 is a schematic cross-sectional view taken along the line II-II' of FIG. 2A.
Figure 4:
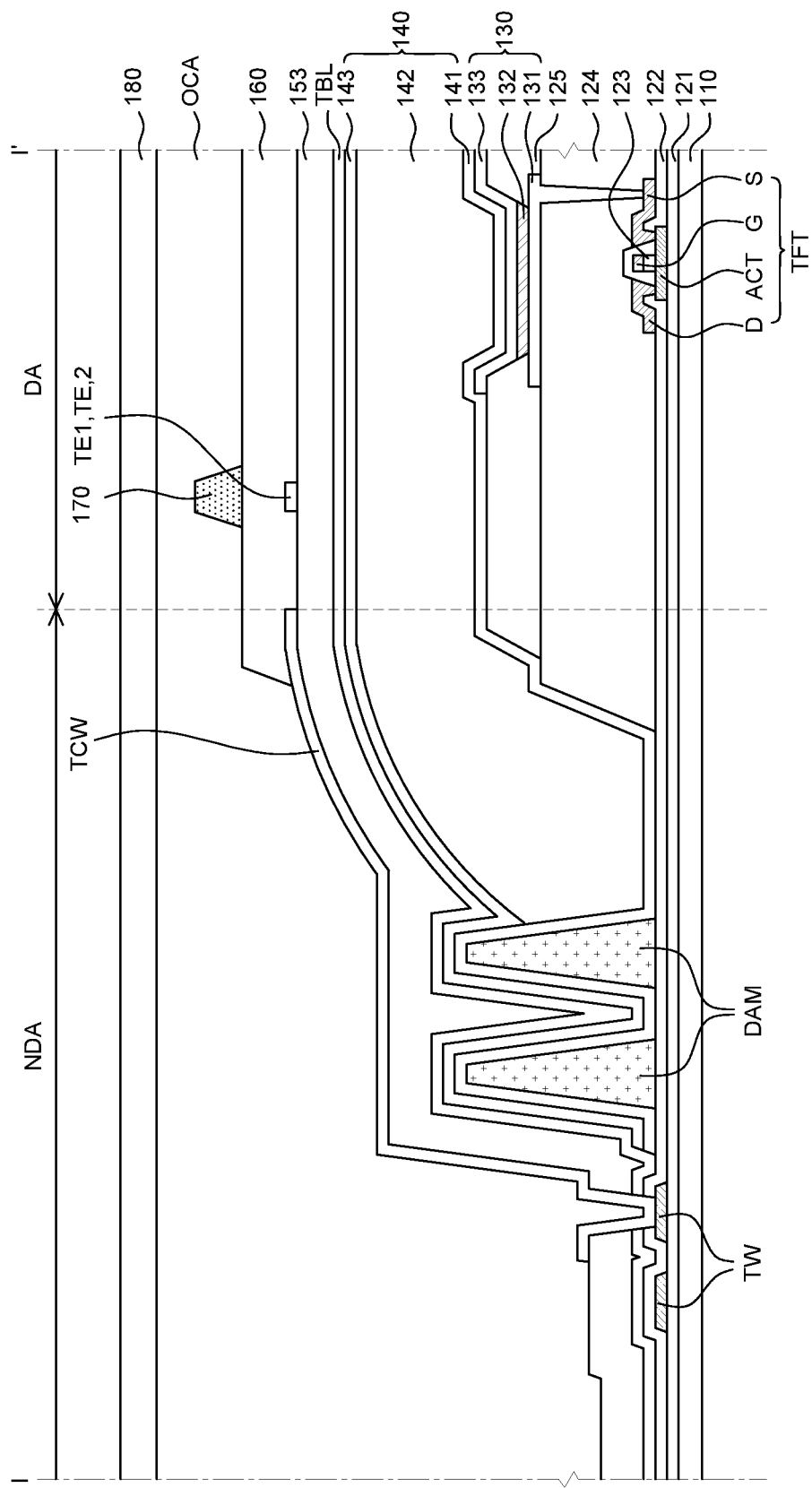
FIG. 4 is a schematic cross-sectional view taken along the line I-I of FIG. 1.

Particularly, FIG. 1 is a schematic plan view of a flexible display device according to an exemplary embodiment of the present disclosure. FIG. 2A and FIG. 2B show a schematic enlarged plan view of an area A of FIG. 1. FIG. 3 is a schematic cross-sectional view taken along the line II-II' of FIG. 2A. FIG. 4 is a schematic cross-sectional view taken along the line I-I' of FIG. 1. In FIG. 1, for the convenience of description, a touch sensor layer which configures a flexible display device according to an exemplary embodiment of the present disclosure is also illustrated.

Referring to FIG. 1, the flexible display device 100 includes a display area DA and a non-display area NDA. The display area DA is an area where a plurality of sub pixels SP1, SP2, and SP3 is disposed to substantially display images. In the display area DA, a plurality of sub pixels SP1, SP2, and SP3 including an emission area for displaying images and a driving circuit for driving the sub pixels SP1, SP2, and SP3 can be disposed.

The plurality of sub pixels SP1, SP2, and SP3 can be disposed in a matrix. The sub pixels SP1, SP2, and SP3 are elements for displaying one color and include an emission area in which light is emitted and a non-emission area in which light is not emitted.

The non-display area NDA encloses the display area DA. The non-display area NDA is an area where images are not substantially displayed and various wiring lines, driving ICs, printed circuit boards, and the like for driving the sub pixels SP1, SP2, and SP3 disposed in the display area DA and the driving circuits are disposed. For example, in the non-display area NDA, various driving ICs such as a gate driver IC and a data driver IC, VSS lines, and the like can be disposed.

The flexible display device 100 includes a touch sensor layer 150 for touch sensing. Referring to FIG. 1, the touch sensor layer 150 includes a plurality of touch driving lines 150a to which a touch driving signal is applied and a plurality of touch sensing lines 150b which generates a touch signal. The plurality of touch driving lines 150a and the plurality of touch sensing lines 150b can be disposed in the display area DA.

Further, in the non-display area NDA, a touch pad TP connected to a touch driver and a plurality of touch lines TW for connecting the touch pad TP and the plurality of touch driving lines 150a and the touch sensing lines 150b can be disposed. Even though in FIG. 1, for the convenience of description, it is illustrated that the plurality of touch lines TW is connected to one touch pad TP, a plurality of touch pads TP can also be configured. For example, one touch pad TP can be connected to every touch line TW.

The plurality of touch driving lines 150a and the plurality of touch sensing lines 150b can be disposed in different directions in the display area DA. For example, each of the plurality of touch driving lines 150a is disposed to extend along an X-axis direction and each of the plurality of touch sensing lines 150b is disposed to extend along a Y-axis direction. Therefore, the touch driving lines 150a and the touch sensing lines 150b are disposed to intersect each other. At the intersection of the touch driving lines 150a and the touch sensing lines 150b, a touch insulating layer 153 is disposed therebetween to insulate the touch driving lines 150a and the touch sensing lines 150b from each other. The plurality of driving lines 150a and the plurality of sensing lines 150b intersect each other to define a plurality of touch cells.

A size of the touch cell can be determined to correspond to an average size of a finger of a user. Specifically, in intersection areas in which the touch driving lines 150a and the touch sensing lines 150b intersect, a capacitor for sensing a touch input can be formed. Therefore, the capacitor serves as a touch sensor by charging charges by a driving signal supplied to the touch driving line 150a and discharging the charged charges to the touch sensing line 150b.

Each of the plurality of touch driving lines 150a includes a plurality of first touch electrodes 151a and first bridges 152a. Each of the plurality of first touch electrodes 151a which configures one touch driving line 150a is disposed to be spaced apart from each other along an X-axis direction and the first bridges 152a electrically connect the first touch electrodes 151a. Each of the plurality of touch sensing lines 150b includes a plurality of second touch electrodes 151b and second bridges 152b. Each of the plurality of second touch electrodes 151b which configures one touch sensing line 150b is disposed to be spaced apart from each other along a Y-axis direction, and the second bridge 152b electrically connects the second touch electrodes 151b. In the drawings, it is illustrated that the first touch electrode 151a and the second touch electrode 151b have a rhombic shape, but it is not limited thereto. Each of the plurality of touch electrodes 151a and 151b can be implemented with various shapes such as a polygonal shape other than a circular shape, an oval shape, and a rhombic shape.

Referring to FIG. 2A together, each of the plurality of touch electrodes 151a and 151b includes a plurality of metal lines TE1 and TE2. The plurality of first touch electrodes 151a and the plurality of second touch electrodes 151b include a plurality of first metal lines TE1 and a plurality of second metal lines TE2, respectively. The first metal line TE1 and the second metal line TE2 extend in different directions. The first metal line TE1 extends along a first direction and the second metal line TE2 extends in a second direction which is different from the first direction.

The plurality of first metal lines TE1 and the plurality of second metal lines TE2 are disposed to intersect each other. Therefore, each of the first touch electrodes 151a and the second touch electrodes 151b has a mesh pattern structure formed by the plurality of first metal lines TE1 and the plurality of second metal lines TE2 which intersect. The first metal line TE1 and the second metal line TE2 can be disposed to intersect to be perpendicular to each other. For example, the first direction can be perpendicular to the second direction.

The plurality of first metal lines TE1 and the plurality of second metal lines TE2 can be formed to extend at an angle different from the folding axis (e.g., X-axis). For example, at least one of the first metal line TE1 and the second metal line TE2 can be formed to extend at an angle of 45° to 90° with respect to the folding axis. An angle formed by the first metal line TE1 and the second metal line TE2 and the folding axis (X-axis) can be 45° to 90°.

When the first metal line TE1 and the second metal line TE2 intersect to have a mesh pattern structure, each of the first metal line TE1 and the second metal line TE2 can be formed to extend at an angle of 40° to 50° with respect to the folding axis (X-axis). The angle is set based on an acute angle between angles formed by the first metal line TE1 or the second metal line TE2 and the folding axis. Even though in the drawings, it is illustrated that the first metal line TE1 and the second metal line TE2 extend at 45° with respect to the folding axis, it is not limited thereto. As described above, when the first metal line TE1 and the second metal line TE2 extend at 45° with respect to the folding axis, it is more advantageous to relieve a stress applied to the touch sensor layer 150 during the folding.

Each of the plurality of first touch electrodes 151a and the plurality of second touch electrodes 151b includes a plurality of openings OA. The opening OA is formed by disposing the plurality of first metal lines TE1 and the plurality of second metal lines TE2 included in each of the plurality of first touch electrodes 151a and the plurality of second touch electrodes 151b to intersect each other. For example, the opening OA is formed by being enclosed by two adjacent first metal lines TE1 and two adjacent second metal lines TE2.

The plurality of sub pixels SP1, SP2, and SP3 can be disposed in each of the plurality of openings OA. For example, the plurality of sub pixels SP1, SP2, and SP3 is enclosed by two adjacent first metal lines TE1 and two adjacent second metal lines TE2. The plurality of sub pixels SP1, SP2, SP3 can include a first sub pixel SP1, a second sub pixel SP2, and a third sub pixel SP3. The first sub pixel SP1, the second sub pixel SP2, and the third sub pixel SP3 can be disposed in a matrix. For example, the first sub pixel SP1, the second sub pixel SP2, and the third sub pixel SP3 can be alternately disposed along the folding axis, for example, the X-axis direction.

The third sub pixel SP3 can be disposed to be spaced apart from the first sub pixel SP1 and the second sub pixel SP2 in the Y-axis direction. The third sub pixel SP3 can be disposed to form a zigzag pattern with the first sub pixel SP1 and the second sub pixel SP2. However, it is not limited thereto and the placement of the sub pixels can vary as needed. The first sub pixel SP1, the second sub pixel SP2, and the third sub pixel SP3 can display different colors. For example, the first sub pixel SP1 can display red, the second sub pixel SP2 can display blue, and the third sub pixel SP3 can display green, but are not limited thereto. In the drawings, each sub pixel SP1, SP2, SP3 is illustrated to have an octagonal shape, but it is not limited thereto. A shape of the sub pixel can be a polygonal shape other than a circular shape, an oval shape, and an octagonal shape.

A spacer 190 and a shock-proof pattern unit 170 are disposed to overlap at least a part of the first metal line TE1 and/or the second metal line TE2, which will be described in more detail below.

Referring to FIGS. 1 to 3 together, the flexible substrate 110 includes at least one folding area FA1 and/or FA2 which is foldable and non-folding areas NFA1, NFA2, and NFA3 excluding the folding area(s). In FIG. 1, it is illustrated that a first folding area FA1, a second folding area FA2, a first non-folding area NFA1, a second non-folding area NFA2, and a third non-folding area NFA3 are included, but it is not limited thereto.

The folding areas FA1 and FA2 are areas which are folded when the flexible display device 100 is folded and can be folded along a specific radius of curvature with respect to the folding axis. For example, the folding axes of the folding areas FA1 and FA2 can be formed in an X-axis direction and the non-folding areas NFA1, NFA2, and NFA3 can extend from the folding areas FA1 and FA2 in a Y-axis direction which is perpendicular to the folding axis. When the folding areas FA1 and FA2 are folded with respect to the folding axis, the folding areas FA1 and FA2 can form a part of a circle or an oval. At this time, a radius of curvature of the folding areas FA1 and FA2 refers to a radius of a circle or an oval formed by the folding areas FA1 and FA2. Radii of the curvature of the first folding area FA1 and the second folding area FA2 can be different from each other during the folding. For example, during the folding, the radius of curvature of the first folding area FA1 can be smaller than the radius of curvature of the second folding area FA2.

The non-folding areas NFA1, NFA2, and NFA3 are areas which are not folded when the flexible display device 100 is folded. For example, when the flexible display device 100 is folded, the non-folding areas NFA1, NFA2, and NFA3 maintain a flat state. The non-folding areas NFA1, NFA2, and NFA3 can be areas extending from the folding areas FA1 and FA2 to the Y-axis direction. At this time, the folding areas FA1 and FA2 can be defined between the non-folding areas NFA1, NFA2, and NFA3. For example, the first folding area FA1 can be defined between the first non-folding area NFA1 and the second non-folding area NFA2 and the second folding area FA2 can be defined between the second non-folding area NFA2 and the third non-folding area NFA3. Further, when the flexible display device 100 is folded with respect to the folding axis, the non-folding areas NFA1, NFA2, and NFA3 can overlap each other.

The flexible substrate 110 supports various elements of the flexible display device 100 such as a thin film transistor or an organic light emitting diode. The flexible substrate can be formed of an insulating material such as a plastic having a flexibility. For example, the flexible substrate 110 can be a plastic substrate selected from polyimide, polyethersulfone, polyethylene terephthalate, and polycarbonate. However, it is not limited thereto and if an insulating material can support the elements, such as the thin film transistor, without being broken even though the flexible display device 100 is repeatedly folded, the insulating material can form the flexible substrate 110 without limitation. The flexible substrate 110 has an excellent flexibility, but is relatively thin and has a smaller rigidity as compared with the glass substrate so that it is difficult to control the substrate during the process of forming the element such as a thin film transistor and the substrate can be sagged.

Accordingly, a support substrate such as a back plate can be selectively disposed below the flexible substrate 110 as needed. The support substrate supports the flexible substrate 110 so as not to be sagged and protects components disposed on the flexible substrate 110 from moisture, heat, and impact from the outside.

The flexible substrate 110 can be formed as a single layer or a plurality of layers. Further, the flexible substrate 110 has an anti-moisture permeability lower than a glass substrate so that in order to supplement the low anti-moisture permeability, at least one inorganic barrier layer can be included. For example, the flexible substrate 110 can be formed with a triple-layered structure which includes a first layer formed of polyimide, a second layer on the first layer and an inorganic barrier layer between the first layer and the second layer. However, it is not limited thereto and the structure of the flexible substrate can vary if necessary.

A buffer layer 121 is disposed on the flexible substrate 110. The buffer layer 121 can improve adhesiveness between layers formed on the buffer layer 121 and the flexible substrate 110 and block impurities introduced from the flexible substrate 110 into the thin film transistor TFT. Further, the buffer layer 121 can suppress or delay the spreading of the moisture and/or oxygen penetrating from the outside of the flexible substrate 110 into the thin film transistor TFT. For example, the buffer layer 121 can be formed of a single layer or a plurality of layers including an inorganic insulating material such as silicon nitride (SiNx) or silicon oxide (SiOx). The buffer layer 121 can be omitted depending on a type of the flexible substrate 110 and a structure of the thin film transistor.

A thin film transistor TFT including a gate electrode G, an active layer ACT, a source electrode S, and a drain electrode D is disposed on the buffer layer 121. The thin film transistor TFT is disposed in each of the plurality of sub pixel SP1, SP2, and SP3 areas. In the drawing, only a driving thin film transistor, among various thin film transistors which can be included in the flexible display device 100, is illustrated. Further, even though in the drawing, it is illustrated that the thin film transistor TFT has a coplanar structure, it is not limited thereto and the thin film transistor can have various structures such as a staggered structure.

The active layer ACT is disposed on the buffer layer 121 and a gate insulating layer 122 is disposed on the active layer ACT to insulate the active layer ACT and the gate electrode G from each other. Further, an interlayer insulating layer 123 is disposed on the buffer layer 121 to insulate the gate electrode G from the source electrode S and the drain electrode D. The source electrode S and the drain electrode D which are in contact with the active layer ACT are formed on the interlayer insulating layer 123.

A planarization layer 124 is disposed on the thin film transistor TFT. The planarization layer 124 covers the thin film transistor TFT to planarize an upper portion. The planarization layer 124 can include a contact hole which electrically connects the thin film transistor TFT and the anode 131.

An organic light emitting diode 130 is disposed on the planarization layer 124. The organic light emitting diode 130 includes an anode 131, a light emitting layer 132, and a cathode 133.

The anode 131 is disposed on the planarizing layer 124 to be separated for every sub pixel SP1, SP2, SP3. The anode 131 is electrically connected to the source electrode S of the thin film transistor TFT. For example, the anode 131 can be electrically connected to the source electrode S through a contact hole formed in the planarization layer 124. The anode 131 is a component for supplying holes to the light emitting layer 132 and can be formed of a conductive material having a high work function. For example, the anode 131 can be formed of one or more materials selected from transparent conductive oxides such as indium tin oxide (ITO), indium zinc oxide (IZO), indium tin zinc oxide (ITZO), tin oxide ($SnO_2$), zinc oxide (ZnO), indium copper oxide (ICO), and aluminum-doped zinc oxide (AZO), but is not limited thereto. When the display device 100 is driven as a top emission type, the anode 131 can further include a reflection layer which reflects light emitted from the light emitting layer 132 toward the cathode 133.

A bank 125 is disposed on the anode 131 and the planarization layer 124. The bank 125 can be formed to expose at least a part of the planarization layer 124. Further, the bank 125 covers an edge of the anode 131 to expose at least a part of the anode 131. The bank 125 is formed to divide an emission area in which the light is emitted, in the sub pixels SP1, SP2, and SP3. For example, the bank 125 is formed between the emission areas of adjacent sub pixels SP1, SP2, and SP3 to define a non-emission area. The bank 125 can be formed of an insulating material which insulates anodes 131 of adjacent sub pixels SP1, SP2, and SP3 from each other. Further, the bank 125 can be formed of a black insulation resin having a high light absorbance to suppress color mixture between adjacent sub pixels SP1, SP2, and SP3.

The spacer 190 is disposed on the bank 125. The spacer 190 supports the mask during the process of forming the light emitting layer 132. When the spacer 190 is disposed on the bank 125, the spacer 190 supports the mask during the process of forming the light emitting layer 132 so that foreign materials caused by the bank 125 which is grounded by the mask can be minimized. The spacer 190 can be formed to have a taper shape or a reversed taper shape.

Referring to FIGS. 2 and 3, the spacer 190 can be formed on the bank 125 to overlap an area in which the first metal line TE1 and the second metal line TE2 intersect. In the drawings, it is illustrated that a planar shape of the spacer 190 is a circular shape, but is not limited thereto. The spacer 190 can be formed to have a polygonal shape such as an oval shape or a rectangular shape.

The light emitting layer 132 is disposed on the anode 131 exposed by the bank 125. The light emitting layer 132 is a layer in which electrons and holes are coupled to emit light and is disposed to emit light having a color corresponding to each sub pixel SP1, SP2, SP3.

The cathode 133 is disposed on the light emitting layer 132. The cathode 133 is not patterned for each of the sub pixels SP1, SP2, and SP3, but can be formed as one layer to cover the light emitting layers 132 and the bank 125. For example, the cathode 133 can be formed as a single layer over the areas of the plurality of sub pixels SP1, SP2, and SP3.

The cathode 133 can be formed of a metal material having a low work function to smoothly supply electrons to the light emitting layer 132. For example, the cathode 133 can be formed of a metal material selected from calcium (Ca), barium (Ba), aluminum (Al), silver (Ag), and alloys including one or more of them, but is not limited thereto. When the flexible display device 100 is driven as a top emission type, the cathode 133 is formed to have a very small thickness to be substantially transparent.

The encapsulation layer 140 is disposed on the cathode 133. The encapsulation layer 140 suppresses deterioration of the components of the flexible display device 100 due to the moisture or oxygen. Further, the encapsulation layer 140 planarizes an upper surface of the organic light emitting diode 130. The encapsulation layer 140 can be formed with a multi-layered structure in which inorganic encapsulation layers 141 and 143 and an organic encapsulation layer 142 are laminated. For example, the encapsulation layer 140 can be configured by at least one organic encapsulation layer 142 and at least two inorganic encapsulation layers 141 and 143 and can have a structure in which the organic encapsulation layer 142 is laminated between the inorganic encapsulation layers 141 and 143. That is, the encapsulation layer 140 can include a multi-layered structure including a first inorganic encapsulation layer 141, an organic encapsulation layer 142 on the first inorganic encapsulation layer 141, and a second inorganic encapsulation layer 143 on the organic encapsulation layer 142, but is not limited thereto. For example, the first inorganic encapsulation layer 141 and the second inorganic encapsulation layer 143 can be independently formed of one or more selected from silicon nitride (SiNx), silicon oxide (SiOx), silicon oxynitride (SiON), and aluminum oxide ($Al_2O_3$), but is not limited thereto. For example, the organic encapsulation layer 142 can be formed of one or more selected from an epoxy resin, polyimide, polyethylene, and a silicon resin, but is not limited thereto.

A touch buffer layer TBL can be disposed on the second inorganic encapsulation layer 143. The touch buffer layer TBL can improve adhesiveness between the encapsulation layer 140 and the touch sensor layer 150. Further, when the touch sensor layer 150 is formed, the touch buffer layer TBL is disposed to protect the organic light emitting diode 130 and a signal line and a pad unit disposed in the non-display area NDA to drive the organic light emitting diode.

Therefore, the touch buffer layer TBL is formed to extend from the display area DA to at least a part of the non-display area NDA. The touch buffer layer TBL can be formed of an insulating material which can be formed at a low temperature to suppress a damage of the organic light emitting diode 130 which is vulnerable to the high temperature and has a low permittivity.

The touch insulating layer 153 is disposed on the touch buffer layer TBL. The touch insulating layer 153 is formed to insulate the touch driving line 150a and the touch sensing line 150b from each other. However, it is not limited thereto and the touch insulating layer 153 can be disposed on the plurality of metal lines TE1 and TE2 depending on the design.

The plurality of metal lines TE1 and TE2 is disposed on the touch insulating layer 153. As described above, the plurality of metal lines TE1 and TE2 configures each of the plurality of touch electrodes 151a and 151b and can include a first metal line TE1 and a second metal line TE2 disposed to intersect each other. Further, the first metal line TE1 and the second metal line TE2 are connected to each other in an intersecting area to be integrally formed. The first metal line TE1 and the second metal line TE2 can be formed of a transparent conductive metal oxide, such as indium tin oxide, indium zinc oxide, or a metal material, such as aluminum (Al), titanium (Ti), and copper (Cu).

A protective layer 160 is disposed on the touch sensor layer 150. The protective layer 160 suppresses the damage of the touch sensor layer 150 due to the external impact and the deterioration of the touch sensor layer 150 due to the outside air. Further, the protective layer 160 planarizes an upper portion of the touch sensor layer 150. The protective layer 160 can be formed as a single layer or a plurality of layers. For example, the protective layer 160 can include an organic protective layer and an inorganic protective layer, but is not limited thereto. The organic protective layer is formed of a transparent insulating resin such as an acrylic resin or a silicon-based resin and the inorganic protective layer is disposed on the organic protective layer and is formed of an inorganic insulating material such as silicon nitride (SiNx) or silicon oxide (SiOx).

A plurality of shock-proof pattern units 170 is formed on the protective layer 160. The shock-proof pattern unit 170 suppresses the damage of the touch sensor layer 150 by the external impact or the folding. Each of the plurality of shock-proof pattern units 170 can be formed on the protective layer 160 so as to overlap at least a part of the plurality of metal lines TE1 and TE2.

Referring to FIGS. 2 and 3, each of the plurality of shock-proof pattern units 170 can be formed so as to overlap the first metal line TE1 or the second metal line TE2. For example, each shock-proof pattern unit 170 can be formed to have a bar shape so as to extend along a length direction of the first metal line TE1 or the second metal line TE2. However, it is not limited thereto and each of the plurality of shock-proof pattern units 170 can be formed to have a polygonal shape, other than a circular shape or a bar shape, so as to overlap at least a part of the first metal line TE1 or the second metal line TE2.

As described above, the first metal line TE1 and the second line TE2 can be disposed to extend at an angle different from the folding axis (e.g., X-axis). Further, each of the plurality of shock-proof pattern units 170 can be formed along a length direction of the first metal line TE1 or the second metal line TE2. Therefore, the plurality of shock-proof pattern units 170 can also be formed to have a bar shape extending at a different angle from the folding axis (X-axis). For example, at least one of the first metal line TE1 and the second metal line TE2 can be formed to extend at an angle of 45° to 90° with respect to the folding axis (X-axis). Therefore, a major axis of each of the plurality of shock-proof pattern units 170 is also formed to extend at an angle of 45° to 90° with respect to the folding axis (X-axis).

As another example, when the first metal line TE1 and the second metal line TE2 intersect to form a mesh pattern, each of the first metal line TE1 and the second line TE2 can be formed to extend at an angle of 40° to 50° with respect to the folding axis (X-axis). In this case, the major axis of each of the plurality of shock-proof pattern units 170 can also be formed to extend at an angle of 40° to 50° with respect to the folding axis (X-axis). As a more desirable example, each of the first metal line TE1 and the second line TE2 can be formed to extend at an angle of 45° with respect to the folding axis (X-axis) and in this case, the major axis of each of the plurality of shock-proof pattern units 170 can also be formed to extend at an angle of 45° with respect to the folding axis (X-axis).

As described above, when the shock-proof pattern unit 170 is formed to extend at an angle different from the folding axis (X-axis), it is more effective to relieve the stress during the folding and thus, the crack or the interlayer separation of the touch sensor layer 150 due to the folding stress can be minimized.

Each of the plurality of shock-proof pattern units 170 can be disposed so as not to overlap the spacer 190 disposed on the bank 125. When the spacer 190 and the shock-proof pattern unit 170 are formed to overlap, a more stress can be applied to the overlapping portion thereof during the folding. Therefore, when the flexible display device 100 is folded and then unfolded, the corresponding area is dented so that an appearance quality of the flexible display device 100 can deteriorate.

For example, heights of the plurality of shock-proof pattern units 170 can be 1 μm to 2 μm, respectively. Within this range, the impact suppressing property is excellent while maintaining the appearance quality and the folding reliability of the flexible display device 100 to be high.

Figure 5A:
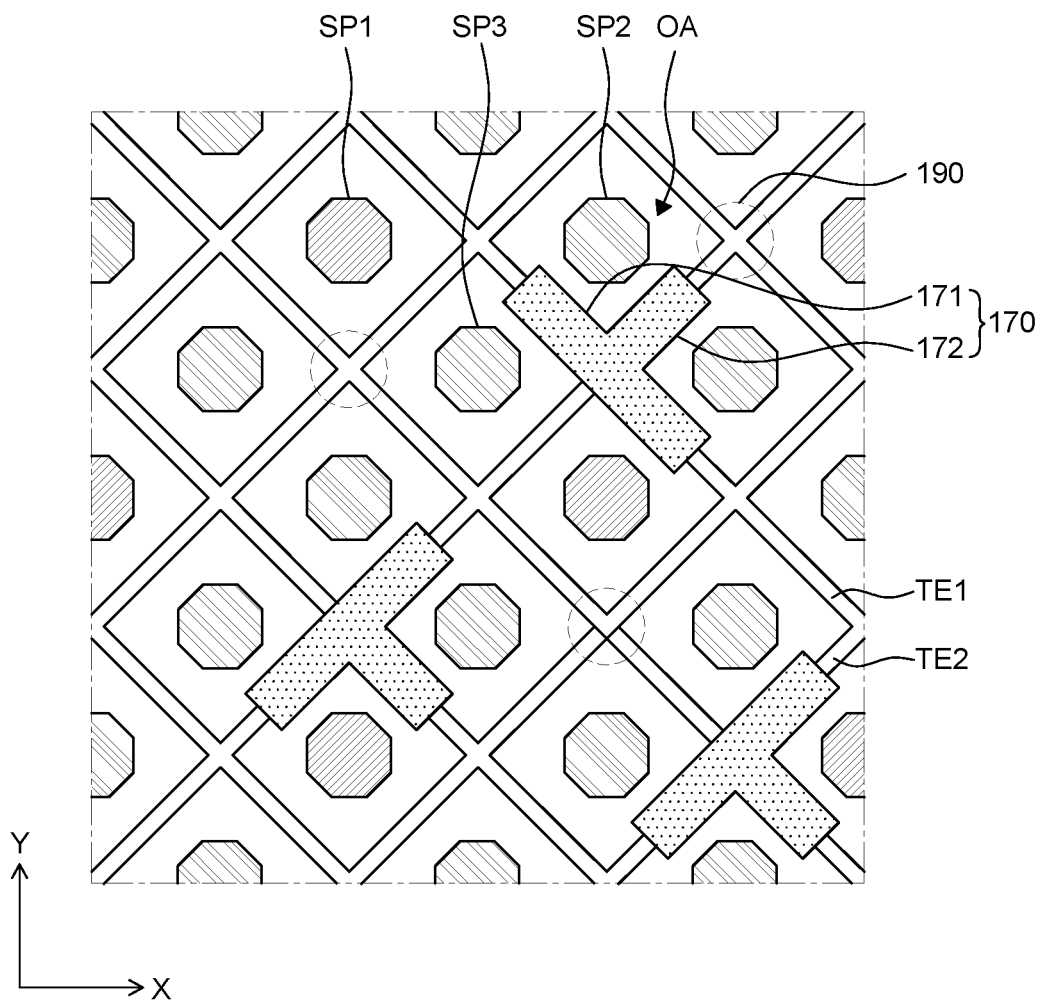
FIGS. 5A to 5C are schematic enlarged plan views for explaining various shapes of a plurality of shock-proof pattern units in a flexible display device according to the present disclosure.
Figure 5B:
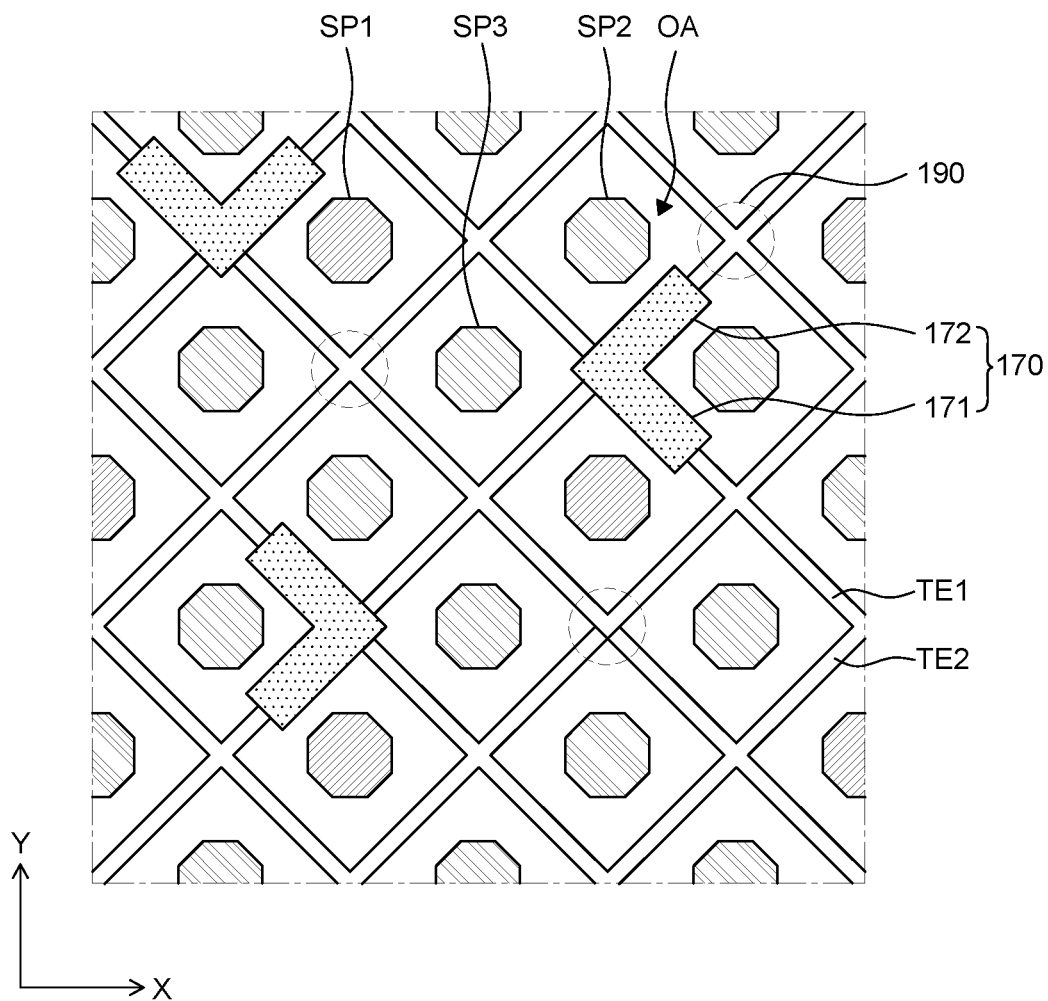
Figure 5C:
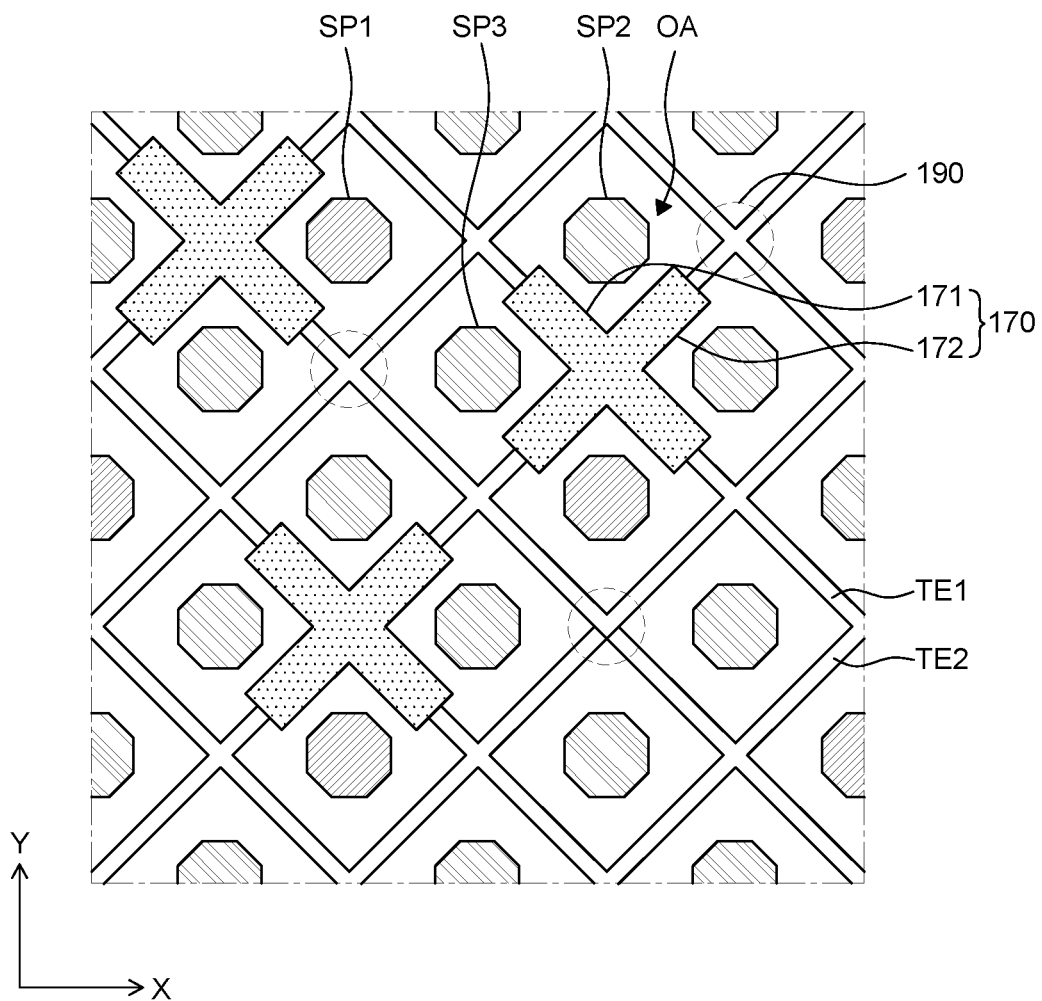

The shock-proof pattern unit 170 can have various shapes so as to overlap at least a part of the first metal line TE1 and the second metal line TE2. FIGS. 5A to 5C are schematic enlarged plan views for explaining various shapes of a plurality of shock-proof pattern units 170 in a flexible display device 100 according to the present disclosure. Components illustrated in FIGS. 5A to 5C are substantially the same as those in FIG. 2A except for the shape of the shock-proof pattern unit 170.

Referring to FIGS. 5A to 5C, each of the plurality of shock-proof pattern units 170 can include a first block 171 and a second block 172. The first block 171 can be formed to overlap at least a part of the first metal line TE1 and extend along a length direction of the first metal line TE1. The second block 172 can be formed to overlap at least a part of the second metal line TE2 and extend along a length direction of the second metal line TE2. The first block 171 and the second block 172 are connected to each other to have various shapes. For example, the first block 171 and the second block 172 are connected to have various shapes such as a T shape, an L shape, or an X shape, but are not limited thereto.

The plurality of shock-proof pattern units 170 can be disposed on the protective layer 160 in each of the folding areas FA1 and FA2 and the non-folding areas NFA1, NFA2, and NFA3. At this time, a density of the plurality of shock-proof pattern units 170 disposed in the folding areas FA1 and FA2 can be larger than a density of the plurality of shock-proof pattern units 170 disposed in the non-folding areas NFA1, NFA2, and NFA3. In this case, the impact resistance and the folding reliability of the folding areas FA1 and FA2 which are more vulnerable to the external impact and the folding stress can be improved.

When the density of the shock-proof pattern unit 170 is large, it can mean that a ratio of the area occupied by the shock-proof pattern unit 170 in the same area is larger. For example, in the condition that each of the shock-proof pattern units 170 has the same shape and the same size, the number of the plurality of shock-proof pattern units 170 disposed in the folding areas FA1 and FA2 can be larger than the number of shock-proof pattern units 170 disposed in the non-folding areas NFA1, NFA2, and NFA3.

As another example, in the condition that the number of shock-proof pattern units 170 is the same, a cross-sectional area of a cross-section of the plurality of shock-proof pattern units 170 disposed in the folding areas FA1 and FA2, taken along the minor axis, can be larger than a cross-sectional area of a minor axis of each of the plurality of shock-proof pattern units 170 disposed in the non-folding areas NFA1, NFA2, and NFA3.

As described above, a radius of curvature of the first folding area FA1 can be smaller than a radius of curvature of the second folding area FA2 during the folding. In this case, a folding stress applied to the first folding area FA1 can be larger than a folding stress applied to the second folding area FA2. Therefore, in order to relieve the folding stress applied to the first folding area FA1, the density of the plurality of shock-proof pattern units 170 disposed on the protective layer 160 corresponding to the first folding area FA1 can be formed to be larger than the density of the plurality of shock-proof pattern units 170 disposed on the protective layer 160 corresponding to the second folding area FA2.

For example, the shock-proof pattern unit 170 can be formed by a photolithographic process using a photoresist. The photoresist can include binders such as a cardo-based resin, an epoxy-based resin, and an acrylic resin, a multi-functional acrylic-based compound, or a photoinitiator, but is not limited thereto. For example, the shock-proof pattern unit 170 can be formed by applying the photoresist on the entire protective layer, placing a mask on the photoresist, and then patterning using the exposure and developing process, but is not limited thereto.

A cover member 180 can be disposed on the plurality of shock-proof pattern units 170. The cover member 180 is bonded onto the shock-proof pattern unit 170 by means of an adhesive member (OCA). The adhesive member can selectively use an adhesive known in the art, which does not deteriorate the optical characteristic and the reliability of the flexible display device 100, and is not specifically limited, such as an optical clear adhesive, an optical clear adhesive resin. When the shock-proof pattern unit 170 is formed on the protective layer 160, a surface area is increased as compared with a case that the shock-proof pattern unit is not formed. Therefore, a contact area with the adhesive member OCA is increased to improve an interfacial adhesiveness. Accordingly, the separation of the protective layer 160 during the folding can be minimized.

Hereinafter, a placement structure of components in the non-display area NDA of the flexible display device 100 according to the exemplary embodiment of the present disclosure will be described in detail with reference to FIG. 4.

Referring to FIG. 4, in the non-display area NDA, a dam DAM can be disposed on the interlayer insulating layer 123. The dam DAM controls the flow of a composition for forming an organic encapsulation layer 142 having a larger mobility when the organic encapsulation layer 142 is formed. The dam DAM can control the flow of the composition for forming an organic encapsulation layer 142 so as not to invade a pad unit in which a signal line such as a data line and a gate line is formed. A plurality of dams DAM can be configured. The plurality of dams DAM is disposed to be spaced apart from each other and each dam DAM can be formed to have a line shape to extend along the non-display area NDA.

Referring to FIGS. 1 and 4, a touch pad TP is disposed at a lower end of the non-display area NDA. The touch pad TP is electrically connected to the touch line TW to be in contact therewith. Further, a touch connection line TCW is disposed on the touch insulating layer 153 in the non-display area NDA to connect the touch line TW and the touch driving line 150a and the touch sensing line 150b. For example, one end of the touch connection line TCW is connected to the touch driving line 150a or the touch sensing line 150b and the other end is connected to the touch line TW. Accordingly, the touch line TW can be electrically connected to the touch driving line 150a and the touch sensing line 150b by a corresponding touch connection line TCW.

The touch connection line TCW can be formed to extend from a boundary of the display area and the non-display area to the non-display area to connect the touch driving line 150a and the touch driving line 150b disposed in the display area DA and the touch line TW disposed in the non-display area NDA.

A plurality of touch lines TW is provided and can be divided into a touch driving line which electrically connects each of the plurality of touch driving lines 150a and the touch pad TP and a touch sensing line which electrically connects each of the plurality of touch sensing lines 150b and the touch pad TP.

The gate insulating layer 122, the interlayer insulating layer 123, the touch buffer layer TBL, and the touch insulating layer 153 extend from the display area DA to the non-display area NDA and includes a contact hole to expose at least a part of the touch line TW. The touch line TW which is exposed by the contact hole is in contact with the corresponding touch connection line TCW to be electrically connected.

Figure 6:
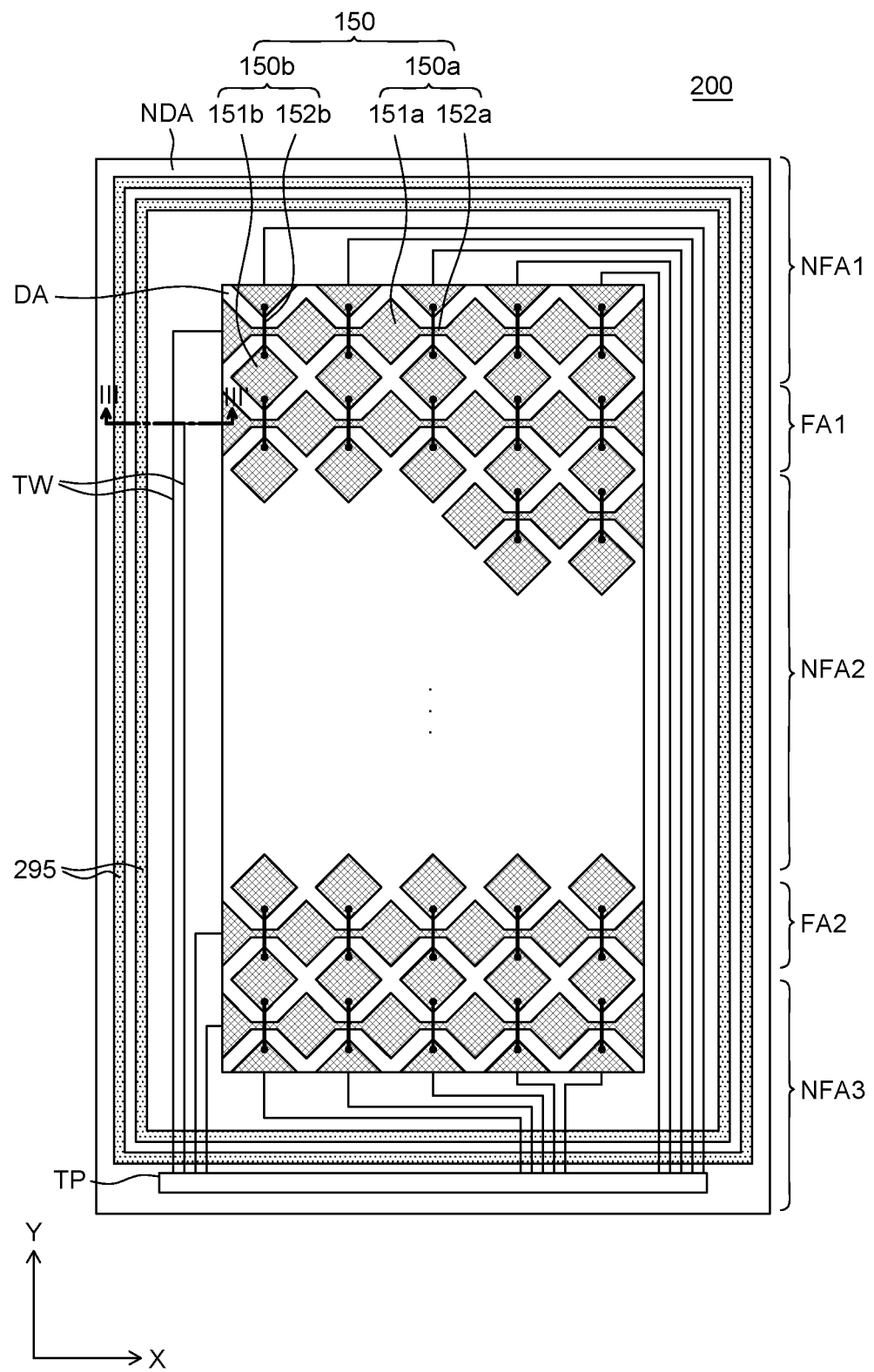
FIG. 6 is a schematic plan view of a flexible display device according to another exemplary embodiment of the present disclosure.
Figure 7:
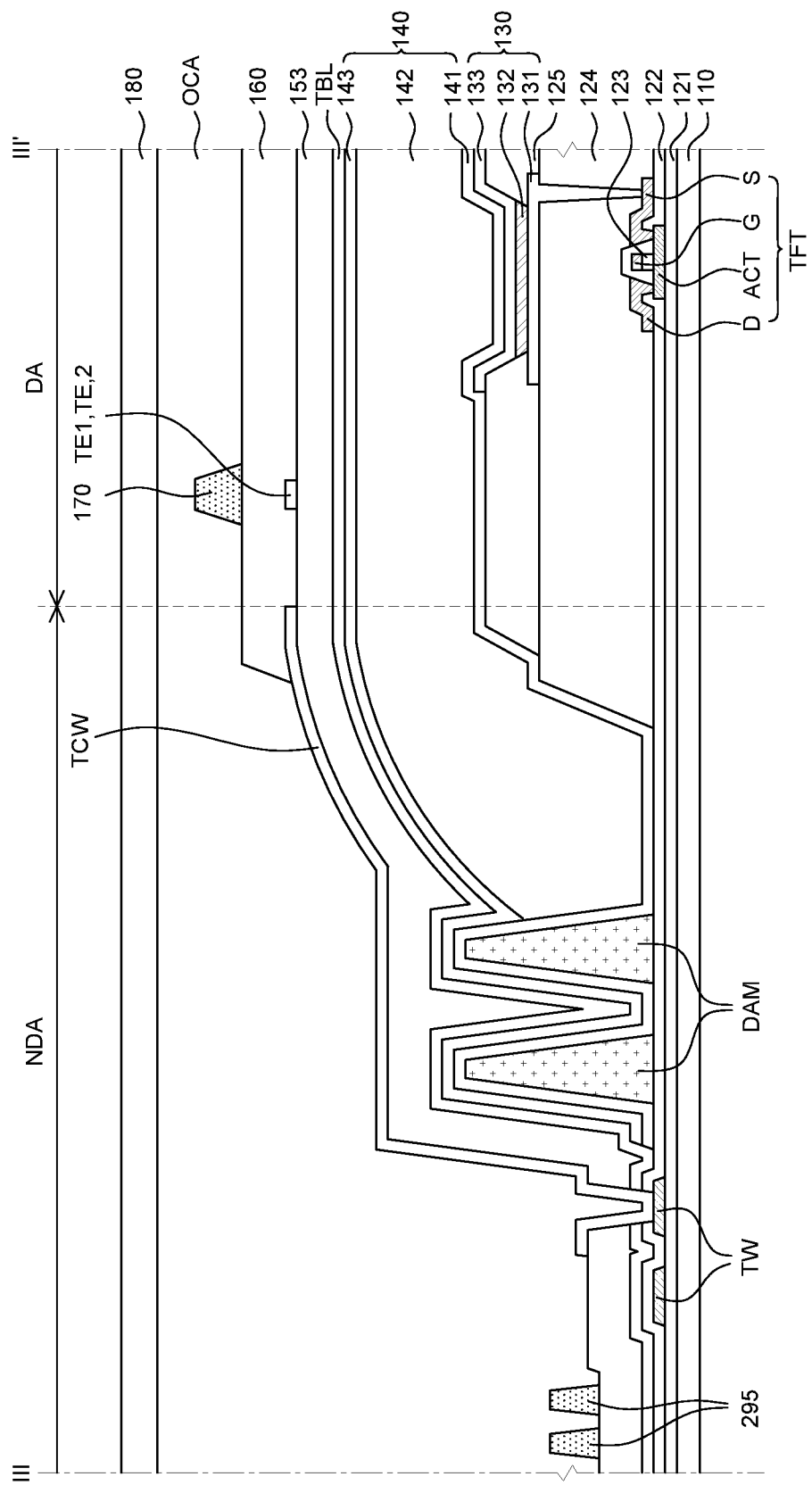
FIG. 7 is a schematic cross-sectional view taken along the line III-III' of FIG. 6.

FIG. 6 is a schematic plan view of a flexible display device according to another exemplary embodiment of the present disclosure. FIG. 7 is a schematic cross-sectional view taken along the line III-III' of FIG. 6. A flexible display device 200 illustrated in FIG. 6 is substantially the same as the flexible display device 100 illustrated in FIGS. 1 to 4 except that an auxiliary spacer 295 is further provided, so that a redundant description will be omitted or may be briefly provided.

Referring to FIG. 6, the auxiliary spacer 295 can be disposed on a touch buffer layer TBL so as to correspond to the non-display area NDA. The auxiliary spacer 295 can be formed to have a line shape along an edge of the non-display area NDA. Accordingly, the auxiliary spacer 295 can have a frame shape.

A plurality of auxiliary spacers 295 can be provided. Each of the plurality of auxiliary spacers can be disposed to be spaced apart from each other along the edge of the non-display area NDA.

The auxiliary spacer 295 can be formed by the same process as the shock-proof pattern unit 170 simultaneously therewith. For example, the auxiliary spacer 295 and the shock-proof pattern unit 170 can be simultaneously formed by a photoresist method, using one mask. Accordingly, the auxiliary spacer 295 and the shock-proof pattern unit 170 can be formed of the same material, but are not limited thereto. When the auxiliary spacer 295 and the shock-proof pattern unit 170 are formed by a photoresist method, the auxiliary spacer 295 and the shock-proof pattern unit 170 can be formed of the same photoresist.

When the auxiliary spacer 295 is disposed, a flowability of the adhesive member OCA applied during the process of bonding the cover member 180 is controlled to easily perform the adhering process. Specifically, the flexible display device 200 uses an adhesive member having a lower modulus than that of the general flat panel display device to ensure the folding reliability. In this case, the flowability is large so that there is a difficulty in the bonding process and an adhering defect and an appearance defect can be caused due to the residuals. The auxiliary spacer 295 controls the flow of the adhesive member OCA to suppress the residuals. Therefore, when the auxiliary spacer 295 is further included, it is advantageous in that the process efficiency is improved and the appearance characteristic is more excellent.

Figure 8:
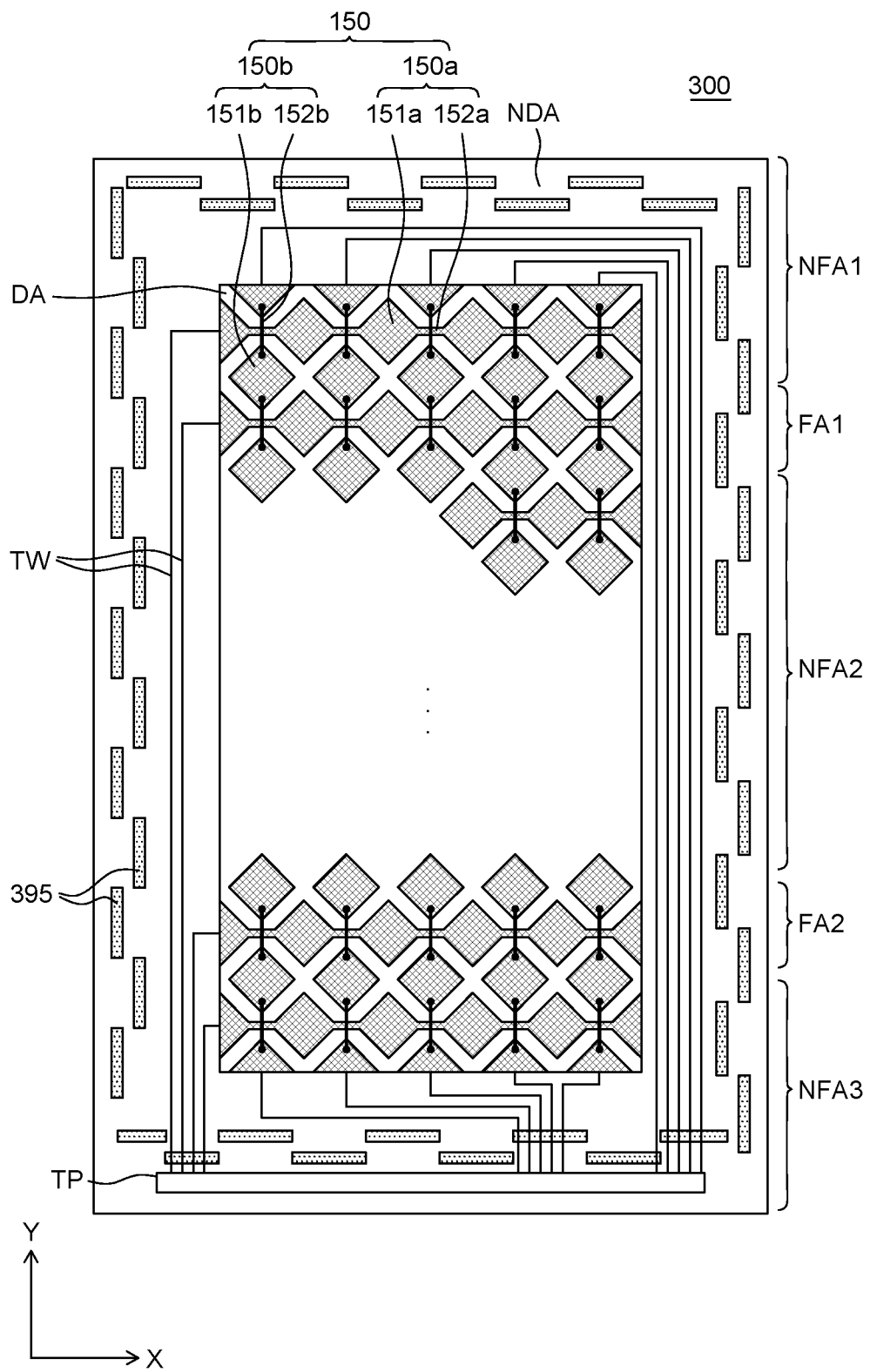
FIG. 8 is a schematic plan view of a flexible display device according to still another exemplary embodiment of the present disclosure.

FIG. 8 is a schematic plan view of a flexible display device according to still another exemplary embodiment of the present disclosure. A flexible display device 300 illustrated in FIG. 8 is substantially the same as the flexible display device 200 illustrated in FIGS. 6 and 7 except for a shape of an auxiliary spacer 395, so that a redundant description will be omitted or may be briefly provided.

Referring to FIG. 8, a plurality of auxiliary spacers 395 is provided and each of the plurality of auxiliary spacers 395 can be formed to have a bar shape extending along a length direction of the edge of the non-display area NDA and a length direction of the dam DAM. The bar-shaped auxiliary spacers 395 do not overlap each other and can be disposed along the edge of the non-display area NDA with a zigzag pattern.

As described above, when the auxiliary spacer 395 is disposed along the length direction of the edge of the non-display area NDA and the length direction of the dam DAM with a zigzag pattern to be spaced apart from each other, the flowability of the adhesive member OCA can be more effectively controlled. Accordingly, during the process of bonding the cover member 180 using the adhesive member OCA, the process efficiency is increased and the adhering defect and the appearance defect due to the residuals can be further suppressed.

The exemplary embodiments of the present disclosure can also be described as follows:

According to an aspect of the present disclosure, a flexible display device including a plurality of sub pixels, includes a flexible substrate including a folding area and a non-folding area with a folding axis, a thin film transistor disposed on the flexible substrate, an organic light emitting diode disposed on the thin film transistor, an encapsulation layer disposed on the organic light emitting diode, a touch sensor layer which is disposed on the encapsulation layer and includes a plurality of touch electrodes, a protective layer disposed on the touch sensor layer, and a plurality of shock-proof pattern units disposed on the protective layer, wherein each of the plurality of touch electrodes includes a plurality of metal lines and each of the plurality of shock-proof pattern units is disposed on the protective layer so as to overlap at least a part of the plurality of metal lines.

The plurality of metal lines can include a first metal line extending in a first direction and a second metal line extending in a second direction which is different from the first direction and each of the plurality of touch electrodes can have a mesh pattern structure formed by intersecting the first metal line and the second metal line.

Each of the plurality of shock-proof pattern units can be formed to have a circular shape (e.g., FIG. 2B) or a polygonal shape (e.g., FIG. 2A) so as to overlap an area in which the first metal line and the second metal line intersect.

At least one of the first metal line and the second metal line can extend at an angle different from the folding axis and each of the plurality of shock-proof pattern units can be disposed to overlap a metal line extending at an angle different from the folding axis, among the plurality of metal lines.

At least one of the first metal line and the second metal line can extend at an angle of 45° to 90° with respect to the folding axis.

Each of the plurality of shock-proof pattern units can be formed to have a bar shape extending along a length direction of the metal line extending at an angle different from the folding axis.

Each of the first metal line and the second metal line can extend at an angle different from the folding axis and each of the plurality of shock-proof pattern units can include a first block extending along a length direction of the first metal line and a second block extending along a length direction of the second metal line, and the first block and the second block can be connected to each other.

Each of the plurality of touch electrodes can include a plurality of openings enclosed by the plurality of metal lines and each of the plurality of sub pixels can overlap each of the plurality of openings.

The flexible display device can further include a planarization layer disposed on the thin film transistor, an anode disposed on the planarization layer, a bank layer disposed on the planarization layer to expose the anode, and a spacer disposed on the bank layer The spacer and the shock-proof pattern unit may not overlap each other.

A density of the plurality of shock-proof pattern units disposed on the protective layer so as to correspond to the folding area can be larger than a density of the plurality of shock-proof pattern units disposed on the protective layer so as to correspond to the non-folding area.

The folding area can include a first folding area and a second folding area having a larger radius of curvature than that of the first folding area and a density of the plurality of shock-proof pattern units disposed on the protective layer so as to correspond to the first folding area can be larger than a density of the plurality of shock-proof pattern units disposed on the protective layer so as to correspond to the second folding area. For example, FIG. 5C shows an example of a schematic enlarged plan view of area B and FIG. 5B shows an example of a schematic enlarged plan view of area C, in which a density of the plurality of shock-proof pattern units disposed on the protective layer so as to correspond to the first folding area (e.g., FA1) can be larger than a density of the plurality of shock-proof pattern units disposed on the protective layer so as to correspond to the second folding area (e.g., FA2).

The flexible substrate can include a display area in which the plurality of sub pixels is disposed and a non-display area which encloses the display area, the flexible display device can further include a dam disposed on the flexible substrate corresponding to the non-display area, and an auxiliary spacer disposed on the flexible substrate so as to overlap at least a part of an outer circumference of the dam.

The auxiliary spacer can be formed to have a bar shape so as to extend along a length direction of the dam.

A plurality of auxiliary spacers can be formed and each of the plurality of auxiliary spacers can be disposed with a zigzag pattern to be spaced apart from each other along a length direction of the dam.

The auxiliary spacer can be formed of the same material as the plurality of shock-proof pattern units.

Although the exemplary embodiments of the present disclosure have been described in detail with reference to the accompanying drawings, the present disclosure is not limited thereto and can be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto.

Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A flexible display device including a display area in which a plurality of sub pixels is disposed and a non-display area which encloses the display area, the flexible display device comprising:
a flexible substrate;
a thin film transistor disposed on the flexible substrate;
an interlayer insulating layer disposed on the flexible substrate;
an organic light emitting diode disposed on the thin film transistor;
an encapsulation layer disposed on the organic light emitting diode;
a touch buffer layer disposed on the encapsulation layer;
a touch sensor layer which is disposed on the encapsulation layer and includes a plurality of touch electrodes;
a dam disposed on the flexible substrate corresponding to the non-display area; and
an auxiliary spacer disposed on the flexible substrate so as to overlap at least a part of an outer circumference of the dam, wherein the auxiliary spacer is disposed on the touch buffer layer which is extended from the display area to at least a part of the non-display area and the dam is disposed on the interlayer insulating layer corresponding to the non-display area.

2. The flexible display device according to claim 1, further comprising:
a planarization layer disposed on the thin film transistor;
an anode disposed on the planarization layer;
a bank layer disposed on the planarization layer to expose the anode; and
a spacer disposed on the bank layer.

3. The flexible display device according to claim 2, further comprising:
a protective layer disposed on the touch sensor layer; and
a plurality of shock-proof pattern units disposed on the protective layer,
wherein each of the plurality of touch electrodes includes a plurality of metal lines and each of the plurality of shock-proof pattern units is disposed on the protective layer so as to overlap at least a part of the plurality of metal lines.

4. The flexible display device according to claim 3, wherein the plurality of metal lines includes a first metal line extending in a first direction and a second metal line extending in a second direction which is different from the first direction and each of the plurality of touch electrodes has a mesh pattern structure formed by intersecting at least one the first metal line and at least one the second metal line.

5. The flexible display device according to claim 4, wherein each of the plurality of shock-proof pattern units is formed to have a circular shape or a polygonal shape so as to overlap an area in which at least one the first metal line and at least one the second metal line intersect.

6. The flexible display device according to claim 4, wherein the flexible substrate includes a folding area and a non-folding area with a folding axis, and
wherein at least one of the first metal line and the second metal line extends at an angle different from the folding axis and each of the plurality of shock-proof pattern units is disposed to overlap at least one of the plurality of metal lines extending at an angle different from the folding axis, among the plurality of metal lines.

7. The flexible display device according to claim 6, wherein at least one of the first metal line and the second metal line extends at an angle of 45° to 90° with respect to the folding axis.

8. The flexible display device according to claim 6, wherein each of the plurality of shock-proof pattern units is formed to have a bar shape extending along a length direction of the at least one metal line extending at an angle different from the folding axis.

9. The flexible display device according to claim 6, wherein each of the first metal line and the second metal line extends at an angle different from the folding axis and each of the plurality of shock-proof pattern units includes a first block extending along a length direction of the first metal line and a second block extending along a length direction of the second metal line, and the first block and the second block are connected to each other.

10. The flexible display device according to claim 3, wherein each of the plurality of touch electrodes includes a plurality of openings enclosed by the plurality of metal lines and each of the plurality of sub pixels overlaps each of the plurality of openings.

11. The flexible display device according to claim 3, wherein the spacer and the shock-proof pattern units do not overlap each other.

12. The flexible display device according to claim 3, wherein the flexible substrate includes a folding area and a non-folding area with a folding axis.

13. The flexible display device according to claim 12, wherein a density of the plurality of shock-proof pattern units disposed on the protective layer so as to corresponding to the folding area is larger than a density of the plurality of shock-proof pattern units disposed on the protective layer so as to correspond to the non-folding area.

14. The flexible display device according to claim 12, wherein the folding area includes a first folding area and a second folding area having a larger radius of curvature than that of the first folding area and a density of the plurality of shock-proof pattern units disposed on the protective layer so as to correspond to the first folding area is larger than a density of the plurality of shock-proof pattern units disposed on the protective layer so as to correspond to the second folding area.

15. The flexible display device according to claim 3, wherein the auxiliary spacer is formed of the same material as the plurality of shock-proof pattern units.

16. The flexible display device according to claim 1, wherein the auxiliary spacer is formed to have a bar shape so as to extend along a length direction of the dam.

17. The flexible display device according to claim 1, wherein a plurality of auxiliary spacers is formed and each of the plurality of auxiliary spacers is disposed with a zigzag pattern to be spaced apart from each other along a length direction of the dam.

* * * * *